United States Patent [19]
Pyle et al.

[11] Patent Number: 5,467,286
[45] Date of Patent: Nov. 14, 1995

[54] METERING UNIT WITH DOWNLOADABLE FIRMWARE

[75] Inventors: Michael W. Pyle, Hermitage; Lee D. Wallis, Murfreesboro, both of Tenn.

[73] Assignee: Square D Company, Palatine, Ill.

[21] Appl. No.: 159,398

[22] Filed: Nov. 3, 1993

[51] Int. Cl.⁶ .......................... G06F 12/02; G01R 19/00
[52] U.S. Cl. .............................................. 364/483; 364/550
[58] Field of Search ...................................... 364/483, 550, 364/551.01, 492; 324/141, 142; 323/211, 209, 205; 395/425, 500; 375/8; 354/322; 358/84

[56] References Cited

U.S. PATENT DOCUMENTS

| | | | |
|---|---|---|---|
| 4,912,552 | 3/1992 | Allison, III et al. | 358/84 |
| 5,132,716 | 7/1992 | Samuels et al. | 354/322 |
| 5,210,854 | 5/1993 | Beaverton et al. | 395/500 |
| 5,268,928 | 12/1993 | Herh et al. | 375/8 |

*Primary Examiner*—Emanuel T. Voeltz
*Assistant Examiner*—M. Kemper
*Attorney, Agent, or Firm*—Larry I. Golden; Kareem M. Irfan

[57] ABSTRACT

Firmware is downloaded to a metering unit located in a distributed power network carrying a power-related waveform, where the metering unit senses power-related parameters associated with the power-related waveform and generates and transmits data representative thereof. The metering unit is provided with a sector-erasable flash EEPROM having a first section for storing main functionality firmware and a second section for storing boot code. The boot code includes a reset portion for resetting the metering unit and a firmware update section for downloading external firmware to the first section. The firmware update section includes a writing routine for writing the external firmware to the first section. The metering unit is also provided with a volatile RAM. The external firmware is downloaded to the first section of the EEPROM by executing the firmware update section. While executing the firmware update section, the writing routine is copied to the RAM and executed therefrom to write the external firmware to the first section of the EEPROM.

15 Claims, 8 Drawing Sheets

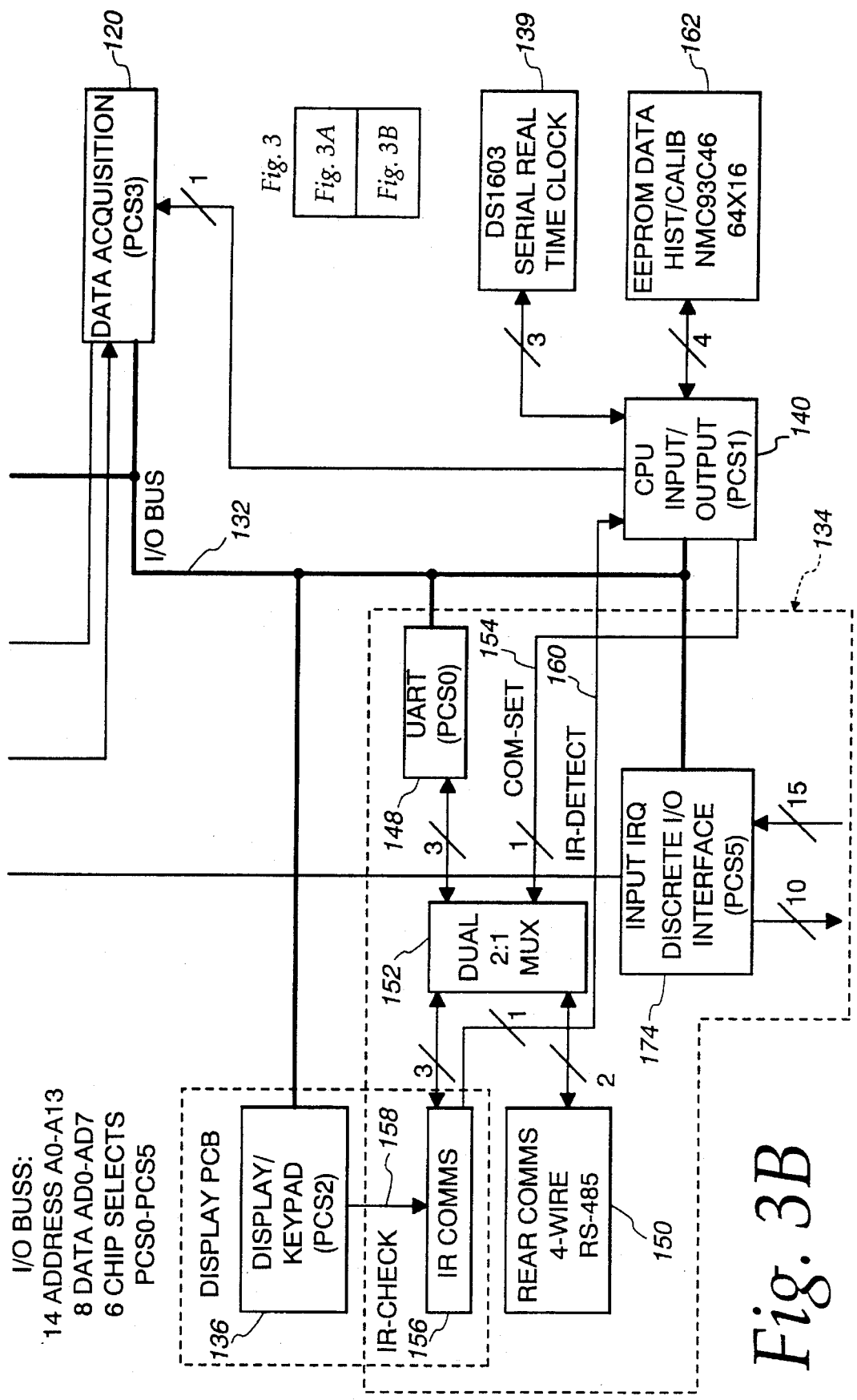

METERING UNIT WITH DOWNLOADABLE FIRMWARE

FIELD OF THE INVENTION

The present invention relates generally to techniques and arrangements for measuring, communicating and analyzing parameters associated with electrical distributed power networks. More particularly, the present invention relates to a metering unit with downloadable firmware.

BACKGROUND OF THE INVENTION

Industrial power users are rapidly becoming aware of the importance of monitoring distributed power networks. Proper monitoring can provide tangible benefits with respect to equipment operation and maintenance; therefore, significant return on investment. More specifically, these benefits include savings in terms of equipment energy cost and maintenance costs, better equipment utilization, and increased system reliability.

Electric utility applications have ranged from supervisory control and data acquisition (SCADA) systems, primarily concerned with remote operations, to distribution automation, which focuses on operating efficiency. Certain utility applications have included devices mounted on power lines for sensing operating parameters of an associated power conductor. For example, U.S. Pat. Nos. 5,224,054 and 5,233,538 describe a circuit monitoring system for a distributed power network. The system includes a plurality of metering units and a control station, which is coupled to each of the metering units via a multi-drop communications link. Each of the metering units is disposed adjacent to an associated one of the branches in the network for sensing power parameters in the branches and for generating and transmitting data representing the power parameters to the control station. The control station is used for generating monitoring commands to each of the metering units to provide the system with full system control and evaluation capability.

In order to expand the capabilities of the metering units and keep the metering units up-to-date with the latest system enhancements, downloadable firmware permits a user to update existing main functionality firmware in the metering units. One drawback of existing metering units is that the metering units do not support multi-drop or network communications protocol or broadcast download capability. Therefore, a metering unit cannot be updated from the control station, but rather must be updated by first disconnecting the metering unit from the multi-drop communications link to remove the metering unit from service and by then connecting a portable personal computer containing the firmware updates to the metering unit using a separate communications link.

Another drawback of existing metering units is that they employ a conventional flash EEPROM to store the main functionality firmware to be updated. Since the entire flash EEPROM must be erased while updating the EEPROM, any essential (i.e., non-erasable) firmware must be stored in a separate integrated circuit memory so that it is not erased during the updates. This additional memory provides an added production cost. Examples of essential firmware, which must maintain integrity at all times, include the section of firmware executed on unit reset (i.e., boot code) and the section of firmware supporting the communications protocol.

A need therefore exists for a metering unit which overcomes the above-noted drawback associated with existing metering units.

SUMMARY OF THE INVENTION

A general object of the present invention is to provide a metering unit with main functionality firmware which can be updated over a multi-drop or network communications link without removing the metering unit from service.

Another object of the present invention is to provide a metering unit which employs a single nonvolatile memory to store both the essential firmware and the main functionality firmware.

Other objects and advantages of the invention will be apparent from the following detailed description and accompanying drawings.

In accordance with the present invention, the foregoing objects are realized by providing a method for downloading firmware to a metering unit located in a distributed power network carrying a power-related waveform, the metering unit sensing power-related parameters associated with the power-related waveform and generating and transmitting data representative thereof. The metering unit is provided with a first non-volatile memory having a first section for storing main functionality firmware and a second section for storing boot code. The boot code includes a reset portion for resetting the metering unit and a firmware update section for downloading external firmware to the first section. The firmware update section includes a writing routine for writing the external firmware to the first section. The metering unit is also provided with a second memory. The external firmware is downloaded to the first section of the first non-volatile memory by executing the firmware update section. While executing the firmware update section, the writing routine is copied to the second memory and executed therefrom to write the external firmware to the first section of the first non-volatile memory.

BRIEF DESCRIPTION OF THE DRAWINGS

Other objects and advantages of the invention will become apparent upon reading the following detailed description and upon reference to the drawings in which.

Figure 1:
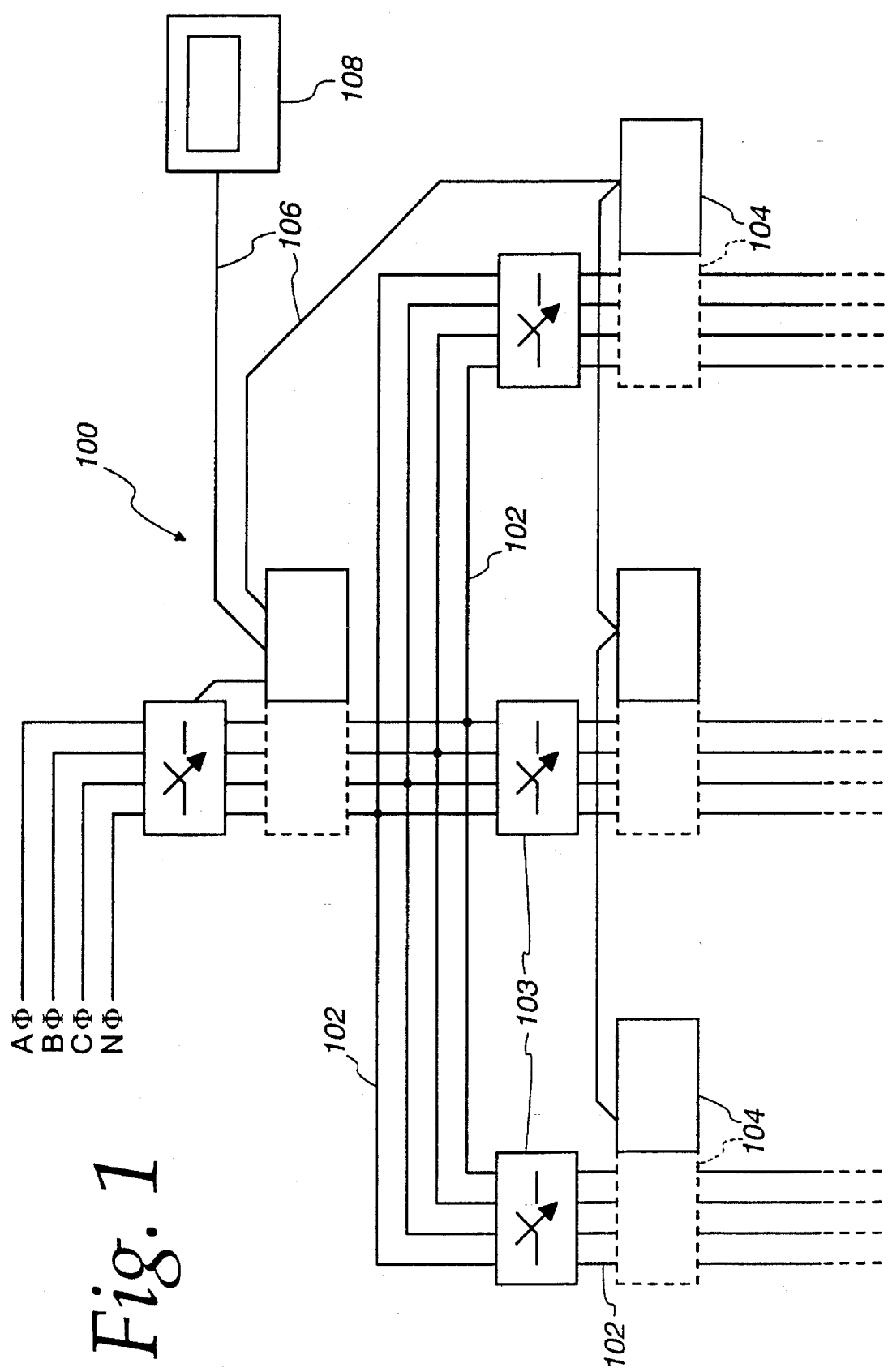
FIG. 1 is a block diagram of a three-phase distributed power network having a monitoring system coupled thereto for monitoring and evaluating power parameters in the network.

While the invention is susceptible to various modifications and alternative forms, a specific embodiment thereof has been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENTS

The present invention is particularly advantageous in industrial applications wherein a distributed power network supplies power to a multitude of loads, e.g., various types of power equipment. FIG. 1 illustrates such an application in which a three-phase (A, B, C), four-wire (A-C, N) distribution system 100 feeds a number of network branches 102 and associated loads (not shown). While this system could be modified to accommodate a three-phase/three-wire, or other, implementation, the system shown in FIG. 1 is representative and the present invention is discussed within the context of this illustrated implementation.

In the system of FIG. 1, the network branches 102 include conventional interruption devices 103 for "breaking" the circuit path defined thereby. Adjacent the interruption devices 103, the system includes associated metering units 104, each of which is communicatively coupled via a communications link 106 to a control station 108. The communications link 106 may be implemented using the protocol set forth in SY/MAX® Instruction Bulletin, Dec. 8, 1988, available from Square D Company, Palatine, Ill. Together, the metering units 104, the communications link 106 and the control station 108 are used to implement a retro-fittable monitoring system for the distribution system 100. The control station 108 is preferably implemented using a desk-top controller, e.g., an IBM PC/AT® and compatibles, having a keyboard, a display and a processor for sending commands and for analyzing information sent from the metering units 104.

The monitoring system of FIG. 1 provides a user, located at the control station 108, with the ability to monitor the electrical activity in each branch, or at each load, remotely. Equally important, the communications link 106 and the control station 108 provide a conveniently located control point at which electrical activity at various points in the system can be monitored at certain predetermined times, under preselected conditions, and analyzed and evaluated for ongoing system and equipment maintenance and control. Using the control station 108, for example, all the metering units 104 may be instructed to sample the power in the associated network branches 102 at any given time. This sampling time can be preprogrammed by the control station 108, thereby collecting power-related information from all the network branches simultaneously. This is an important advantage, because it can be used to provide an overall evaluation of the system without having to compensate for errors that result from time-dependent system variations.

Figure 2:
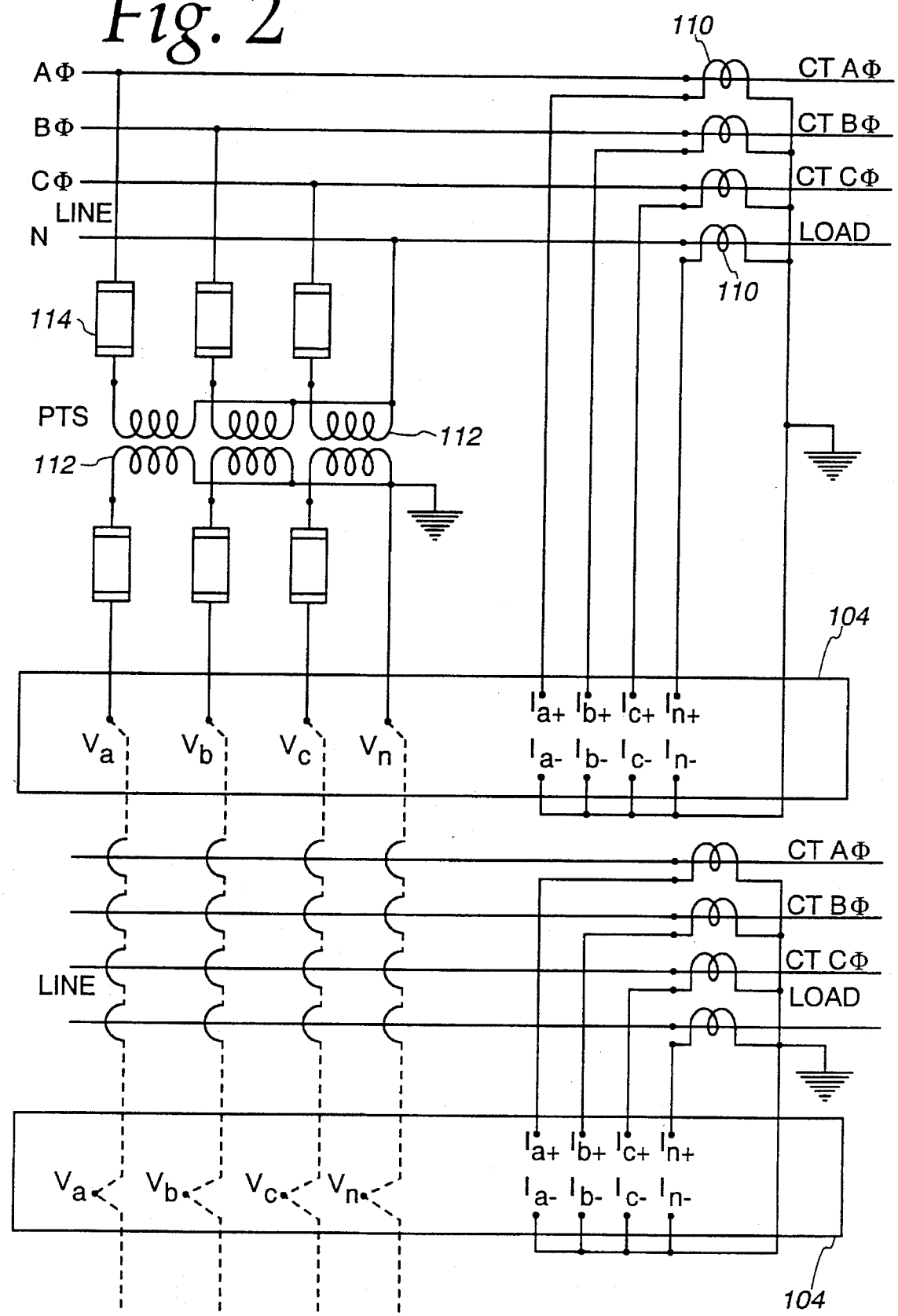
FIG. 2 is a diagram illustrating, in more detail, the manner in which the system of FIG. 1 is coupled to the three-phase distributed power network.

FIG. 2 illustrates a manner in which the metering units 104 of FIG. 1 may be coupled to the lines in each of the network branches 102. As shown in FIG. 2, one current transformer (CT) 110 is used for each phase and neutral line in each metering unit 104 with one side of each CT 110 electrically connected to ground for the associated metering unit 104. However, three potential transformers (PT) 112 may be shared by more than one metering unit 104 by arranging the PTs 112 to sense the voltages in parallel, unlike the arrangements of the CTs 110. Fuses 114 may be used to protect all the metering units 104 at their PT input terminals. Thus, a total of nine lines (twelve terminals) are used at each metering unit 104 for coupling the power-related information from the CTs 110 and PTs 112 to the metering units 104.

Figure 3A:
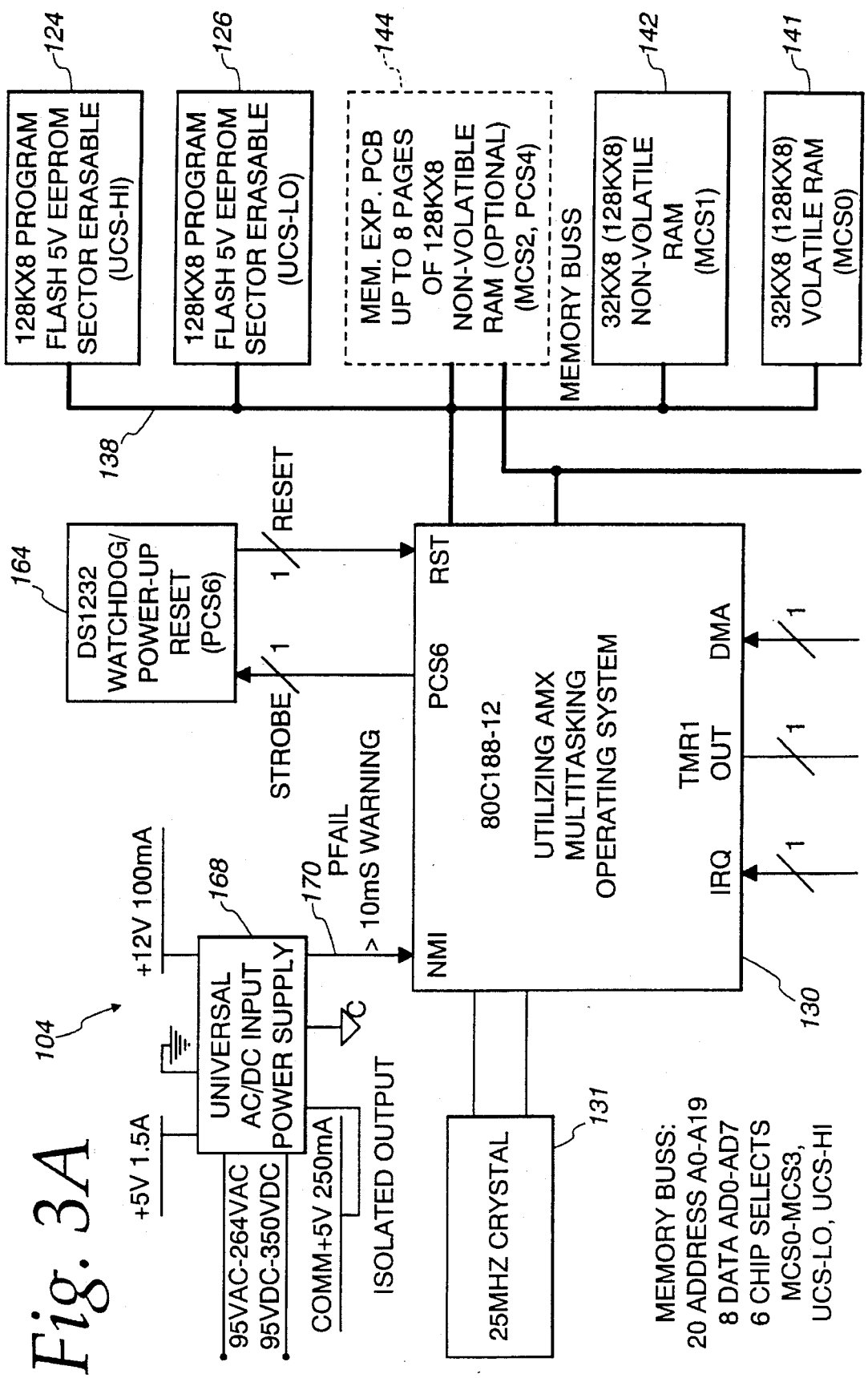
FIG. 3 is a block diagram of a metering unit or circuit monitor, embodying the present invention, which may be used for monitoring power parameters in the network of FIG. 1 and for transmitting that information to a central point for evaluation.

A preferred manner of processing the power-related information within each metering unit 104 is illustrated in FIG. 3. Generally, the power-related information is introduced to the metering unit 104 via a data acquisition unit 120. In the preferred embodiment described here, the metering unit 104 utilizes two EEPROMS 124 and 126, preferably 128×8 Program Flash 5V, sector-erasable EEPROMs, to store boot code and main functionality firmware. The boot code includes both unit reset firmware for initializing processor parameters and firmware for downloading firmware updates over the communications link 106. A processor 130 executes the firmware to control the operation of the metering unit 104. The processor 130, preferably operating in an AMX Multitasking Operating System, is desirably coupled to a 25 MHz crystal 131 to provide a clock for the processor 130 and synchronization to the metering unit 104. An I/O bus 132 couples the processor 130 to various I/O components of the metering unit 104, such as communications circuitry 134, display/keypad circuitry 136 and the data acquisition unit 120. The I/O bus 132 can include a 14-bit wide address bus, an 8-bit wide data bus and 6 chip select lines (PCS0-PCS5). A memory bus 138 couples the processor 130 to the various memory units utilized by the preferred embodiment of the metering unit 104. The memory bus can include a 20-bit wide address bus, 8-bit wide data bus and six memory chip select lines (MCS0-MCS3, UCS-LO and UCS-HI). The processor 130 can be an 80C188-12 manufactured by Intel Corporation of Santa Clara, Calif.

The processor 130 of the preferred embodiment utilizes CPU I/O chips 140 coupled to the I/O bus 132 to provide latches and an input/output port for the address-based processor 130. The processor 130 controls the various components designated in FIG. 1 with a PCS# in parenthesis by selectively enabling the various components through the chip select lines (PCS0-PCS5) of the I/O bus 132. The processor 130 transfers data between the various components of the metering unit 104 utilizing the I/O bus 132 and the CPU I/O chips 140. Similarly, the processor 130 controls and enables the various memory components by selectively enabling the memory components through the memory select lines of the memory bus 138. Moreover, the processor 130 accesses and stores data within the various memory components using the memory bus 138. The processor 130, by enabling and controlling the digital acquisition circuitry 120 through the I/O bus 132, collects simultaneous samples of the power-related information from the CTs 110 and the PTs 112 (FIG. 2) to acquire an extremely accurate and clear representation of the current and voltage waveforms carried in the associated network branch 102. It can be desirable for all the metering units 104 to time stamp data from the respective branches 102. Accordingly, the metering unit 104 is equipped with a serial real-time clock 139, such as a DS1603 made by Dallas Semiconductor of Dallas, Tex.

The data acquisition circuitry 120, under the control of the processor 130, digitizes these analog samples, and the processor 130 desirably stores those digital sample values using conventional, non-volatile RAM 142.

The processor 130 collects this digital sample data and performs power-related calculations on the digital sample data as directed by the firmware. Preferably, the processor 130 utilizes a conventional RAM 141 to assist in power-related calculations involving the sample digital data. These power-related calculations preferably include: the average demands of current in each of the three phases and of real power, the predicted demand of real power, the peak demand of current in each of the three phases and of real power, the accumulated real and reactive energy, rms calculations of voltage and current, and power quality calculations such as total harmonic distortion.

The processor 130 can transmit the processed or stored digital data to the control station 108 through the communications circuitry 134 that is coupled to the I/O bus 132. The communications circuitry 134 includes a communications interface 148. In the preferred embodiment, the communications interface 148 is a UART (universal asynchronous receiver/transmitter) that receives and transmits digital signals. The communications interface 148 is coupled to the I/O bus 132 and provides two-way communications between the metering unit 104 and the control station 108 through a communications port 150.

The communications port 150 is preferably a 4-wire, RS-485 communications port and is coupled to the communications interface 148 through a multiplexor (MUX) 152. The MUX 152 is controlled by a COM-SEL bit, and, in the absence of a Optical Communications Interface (OCI), the processor 130 controls the signal on a COM-SEL line 154 from the CPU I/O chips 140 to the COM-SEL bit of the MUX 152 and creates a data path between the communications interface 148 and the communications port 150. In the presence of the OCI (not shown), the processor 130 utilizes the CPU I/O chips 140 to toggle the signal on the COM-SEL line 154, and the MUX 152 alters the data path to route digital signals between the communications interface 148 and an infrared communications port 156. The infrared communications port 156 interacts with the OCI and provides an infrared communications link between the metering unit 104 and a personal computer (not shown) connected to the OCI. The OCI is preferably an infrared to RS-232 interface, and the personal computer links to the RS-232 port of the OCI interface.

The metering unit 104 includes display/keypad circuitry 136 to provide a user with a local interface with the metering unit 104. As previously stated, the display/keypad circuitry 136 is coupled to the I/O bus 132 to enable the user to interrupt the firmware operation of the processor 130 and perform any desired operations upon the metering unit 104. Additionally, in the illustrated embodiment, the display/keypad circuitry 136 transmits a digital signal to the infrared communications port 156 with an IR-CHECK line 158 for determining the presence of the OCI, and, if present, the OCI responds by sending the digital signal back to the infrared communications port 156 and through an IR-DETECT line 160 to the CPU I/O chips 140. The processor examines the signal on the IR-DETECT line 160 to determine if an OCI is present adjacent to the infrared communications port 156. As previously discussed, if an OCI is present, the preferred embodiment of the metering unit 104 utilizes the CPU I/O chips 140 to switch the MUX 152 into routing digital signals from the infrared communications port 156 to the communications interface 148.

Communications between the metering unit 104 and the control station 108 can be facilitated by entering the device address and the communication baud rate via the display/keypad circuitry 136. This allows the control station 108 to differentiate between the multitude of metering units 104 communicating over the communications link 106 (FIG. 1). Preferably, the designated address for the metering unit 104 can be programmed and stored in the non-volatile RAM 142 of the metering unit 104. In a preferred embodiment, for the metering unit 104, historical, calibration and identification information is preferably stored in a serial EEPROM 162 coupled to the CPU I/O chips 140. The EEPROM 162 is preferably a NMC93C46 EEPROM made by National Semiconductor of Santa Clara, Calif.

The metering unit 104 also includes a watchdog timer circuit 164 and a power supply 168. The watchdog timer circuit 164 is used by the processor 130 in a conventional manner to monitor its integrity, and may be implemented using a DS1232-type IC, available from Dallas Semiconductor, Inc. of Dallas, Tex. In the illustrated preferred embodiment, the processor 130 must continuously strobe the watchdog timer circuit 164, and if the processor 130 halts the expected strobing, the watchdog timer circuit 164 resets the processor 130. Additionally, the watchdog timer circuitry 164 resets the processor 130 if the Vcc voltage from the power supply 168 drops below a threshold voltage value.

The power supply 168 is conventional. The power supply 168 can be fed from an AC line to provide ±12v (Volts) and +5v ("Vcc") for the entire metering unit 104 and a communications supply ("COM +5v") for the communications circuitry 134. The power supply 152 is monitored by the processor 130, using a power fail line 170 coupled to the NMI (non-maskable interrupt) of the processor 130 to interrupt its operation and allow the processor 130 to store any necessary data in non-volatile memory, such as the non-volatile RAM 142, before operating power is lost. Preferably, the power supply 152 generates the power fail signal on a power loss or power sag at least 10 ms prior to dropping the Vcc output out of regulation.

The metering unit 104 is also equipped with an I/O interface 174 coupled to the I/O bus 132 and having latches and buffers for providing optional I/O operations. For example, the I/O interface 174 can be used to trigger the interruption devices 103 (FIG. 1) when one or more predetermined conditions have been detected within the metering unit 104 or at the control station 108. Moreover, the I/O interface 174 can be coupled to an external module or monitor if desired.

An important application of the present invention concerns retro-fitting the metering unit 104, or the entire monitoring system of FIG. 1, with a previously installed interruption device 103 having a peak sensing tripping mechanism. Interruption devices of this type trip upon the detection of the peak of the waveform exceeding a predetermined threshold. Presuming the presence of a non-sinusoidal waveform, the metering units 104 of the present invention detect the peak value, calculate the RMS (root mean squared) value for a sinusoidal waveform having the same peak value and report that calculated value to the control station 108. This allows a user at the control station 108 to evaluate the suitability of the interruption device for the load connected thereto.

An important feature of the metering unit 104 is the use of the flash EEPROMs 124, 126 for storing the boot code and the main functionality firmware. Since these EEPROMS may be erased in individual sectors, the sectors containing the main functionality firmware may be updated without erasing the boot code. Thus, the boot code need not be located in a separate non-volatile memory.

Figure 4A:
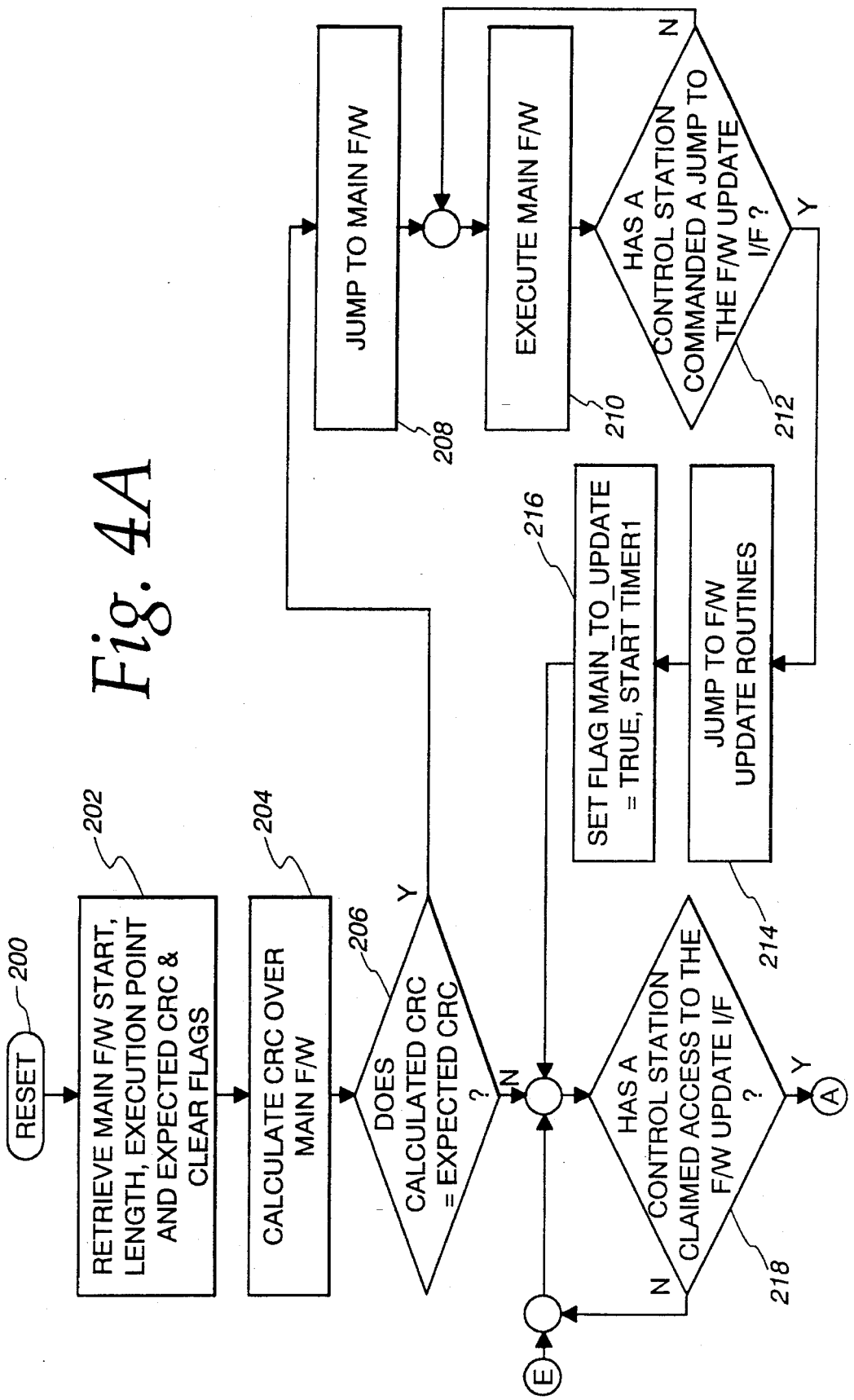
FIGS. 4a through 4d are flow charts showing the operation of using a control station to update main functionality firmware stored in a sector-erasable flash EEPROM of the metering unit in FIG. 3.
Figure 4B:
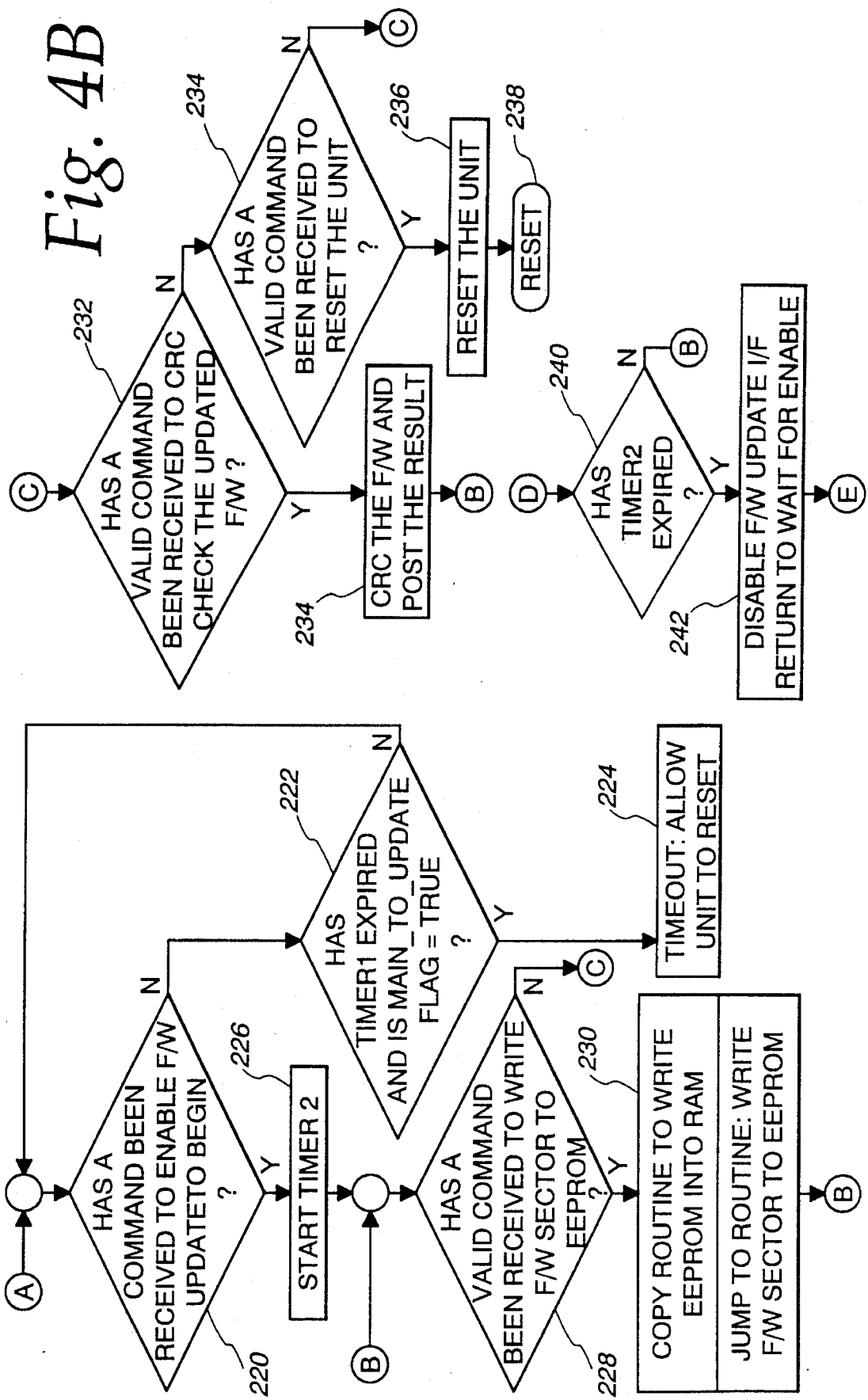
Figure 4C:
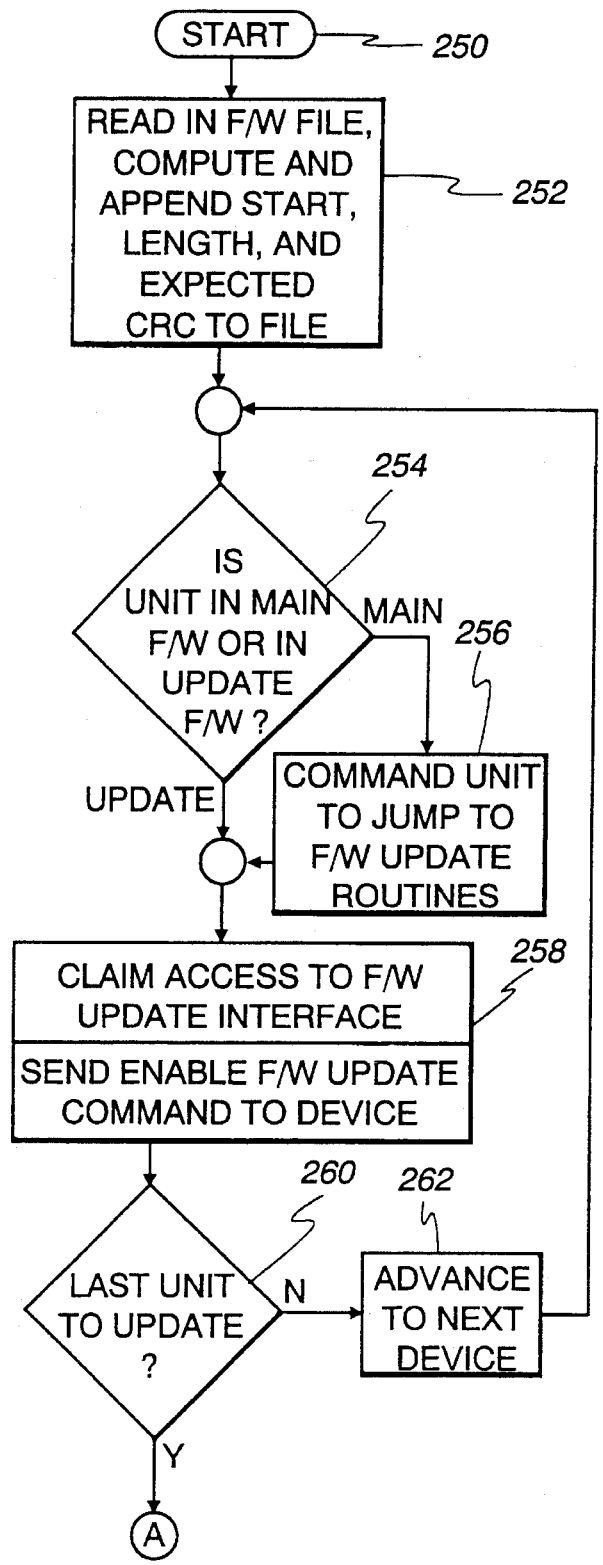
Figure 4D:
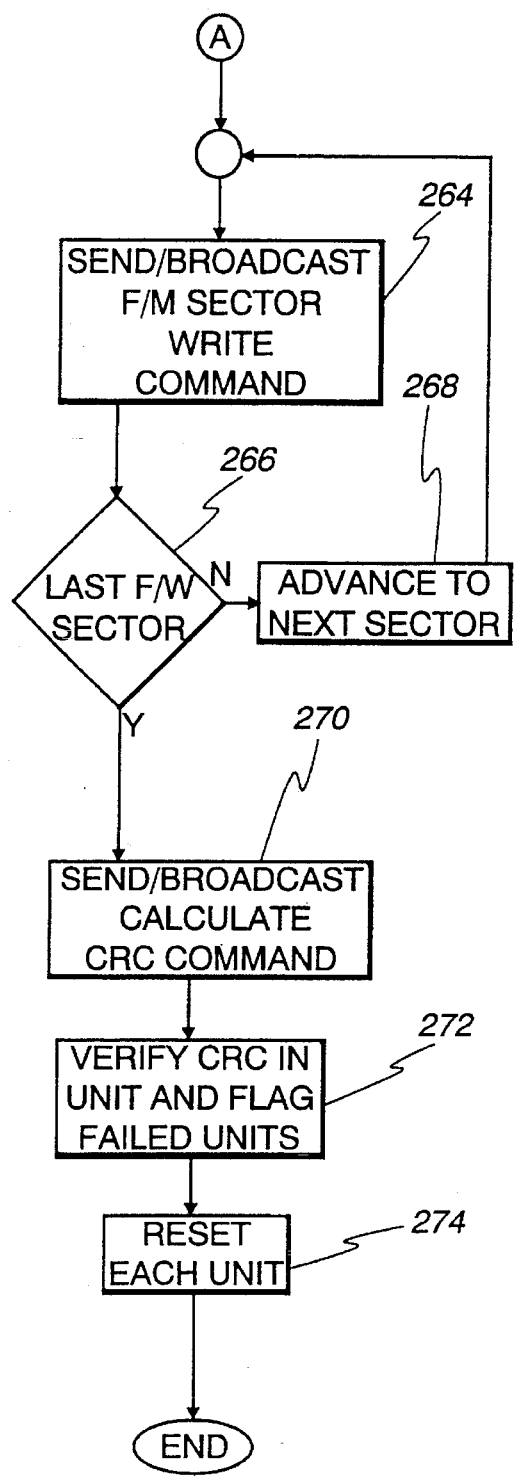

FIGS. 4a through 4d are flowcharts showing the process of using a control station, such as the control station 108 in FIG. 1, to update the main functionality firmware in the sector-erasable EEPROMS 124, 126 of the metering unit 104. FIGS. 4a and 4b represent the operations performed by the boot code and its firmware update routines in the metering unit 104, while FIGS. 4c and 4d represent the operations executed by the control station 108 to perform a firmware update.

Referring first to the boot code of the metering unit 104, upon reset of the metering unit (step 200), the boot code clears all flags and accesses from one of the EEPROMS the start address, the length, and the expected CRC value (i.e., cyclic redundancy check value) of the main functionality firmware (step 202). The expected CRC value for the main functionality firmware stored in the EEPROMS had already been generated prior to downloading that firmware into the metering unit 104. An expected CRC value is appended to any main functionality firmware downloaded into the metering unit 104 so that it can later be used to validate that firmware.

Next, the boot code performs a cyclic redundancy check over the entire main functionality firmware contained in the EEPROMS 124, 126 (step 204), and compares the calculated value with the expected CRC value (step 206). If the calculated CRC value is equal to the expected. CRC value, then the integrity of the main functionality firmware has been verified and the boot code will pass control to the main functionality firmware (step 208). The main functionality firmware is executed (step 210) until the control station 108 commands a jump to the firmware update routines of the boot code (steps 212 and 214). After jumping to the firmware update routines of the boot code, the boot code sets an update flag to true and starts a first timer (TIMER1) (step 216). At this point, the boot code waits for the control station to claim sole access rights to the command interface of the metering unit 104 (step 218) and to send a command enabling the firmware update to begin (step 220). If the first timer (TIMER1) expires before the control station sends the command to enable the firmware update to begin (step 222), then the boot code will perform a unit reset (step 224).

If at step 206 the calculated CRC value is not equal to the expected CRC value, the main functionality firmware has been corrupted. In this case, the boot code retains control and waits for the control station to claim access to the command interface of the metering unit 104 (step 218). Once the control station claims access to the firmware update command interface, the boot code waits to receive a command enabling the firmware update to begin (step 220).

In response to receiving a command to enable the firmware update to begin, the firmware update routines of the boot code start a second timer (TIMER2) (step 226) and the boot code waits to receive a valid command from the control station to overwrite a sector of one of the EEPROMs 124, 126 (step 228). If such an overwrite command is received, the firmware update of the sector is performed by copying the routine required to write to the EEPROMs into the volatile RAM 141 and by jumping to that writing routine to overwrite the EEPROM sector (step 230). It is necessary to copy the writing routine into the volatile RAM 141 because the sector-erasable flash EEPROMs 124, 126 cannot be read from while any sector is being written. After overwriting the EEPROM sector, the boot code waits for another valid command from the control station to overwrite another EEPROM sector. During the firmware update, each byte of data in a communications packet is parity checked and a conventional packet checksum or CRC is used for packet validation.

If no valid overwrite command is received at step 228, flow proceeds to step 232, where the boot code determines whether or not a valid command has been received to CRC check the entire updated main functionality firmware. After such a command is received and the entire main functionality firmware has been updated along with its associated start address, length, and expected CRC value, the boot code performs a CRC calculation over the updated firmware and posts the result (step 234). This CRC calculation is read back by the control station 108 and used to verify that a valid firmware update has occurred. If the firmware update was valid, the boot code waits for a command from the control station 108 to reset the metering unit 104 (step 234). In response to receiving this reset command at step 234 before the second timer (TIMER2) expires at step 240, the boot code performs a unit reset (steps 236 and 238). If, however, no reset command is received at step 234 and the second timer (TIMER2) expires, the boot code disables the command interface and returns to wait for the control station 108 to claim access to the command interface (step 242).

FIGS. 4c and 4d illustrate the operations performed by the control station 108 while updating the main functionality firmware of the metering unit 104. In particular, the control station 108 initially reads in a firmware file to be downloaded to the metering unit 104, and then computes and appends the starting address, length, and CRC value for that firmware file (steps 250 and 252). This computed CRC value is the expected CRC value used to validate the firmware file following its download to the metering unit. Next, the control station 108 determines whether or not the metering unit 104 is executing its main functionality firmware or the firmware update routines of its boot code (step 254). If the metering unit 104 is executing its main functionality firmware, the control station 108 commands the metering unit 104 to jump to the firmware update routines (step 256).

Once the metering unit 104 is executing its firmware update routines, the control station 108 claims access to the command interface of the metering unit 104 (step 258). Claiming sole access rights to the command interface of the metering unit 104 allows the firmware update to occur on a multi-drop communications network which supports multiple masters or peer-to-peer communications by preventing all other devices from gaining communications access to the command interface. Sole possession of the command interface of the metering unit 104 prevents other devices from interrupting the firmware update by sending conflicting commands to that command interface. All other communications to the metering unit 104 which do not require access to the command interface may occur as normal. For example, other devices may still request information from status registers in the unit 104.

After claiming possession of the command interface of the metering unit 104, the control station 108 sends a firmware update command to the metering unit to enable the firmware update to begin (step 258). If desired, the control station 108 may claim access to multiple metering units for firmware update and then perform a parallel firmware update by broadcasting the firmware update packet to all devices involved in the update. This ability to simultaneously update multiple metering units is indicated by steps 260 and 262, where the control station 108 may cause additional metering units to jump to their respective firmware update routines and then claim access to their respective command interfaces.

After claiming access to the command interfaces of those metering units the control station 108 wants to update and after sending a firmware update command to each of these metering units, the control station 108 broadcasts a series of commands to write firmware sectors to each of the metering units (steps 264, 266, and 268). Following completion of the firmware update, the control station 108 commands the metering units to calculate and post the CRC of the updated firmware (step 270). The control station 108 then verifies the posted results (step 272) and sends a command to reset the updated metering units (step 274).

The firmware update process illustrated in FIGS. 4a through 4d ensure that if the update process is interrupted for any reason, the metering unit 104 will maintain the functionality required to initiate a new firmware update. In particular, the update process does not affect the boot code containing the firmware supporting the process, but rather only permits the main functionality firmware to be updated. This boot code has the functionality required to initiate a new firmware update in the event the update process is interrupted.

Figure 5A:
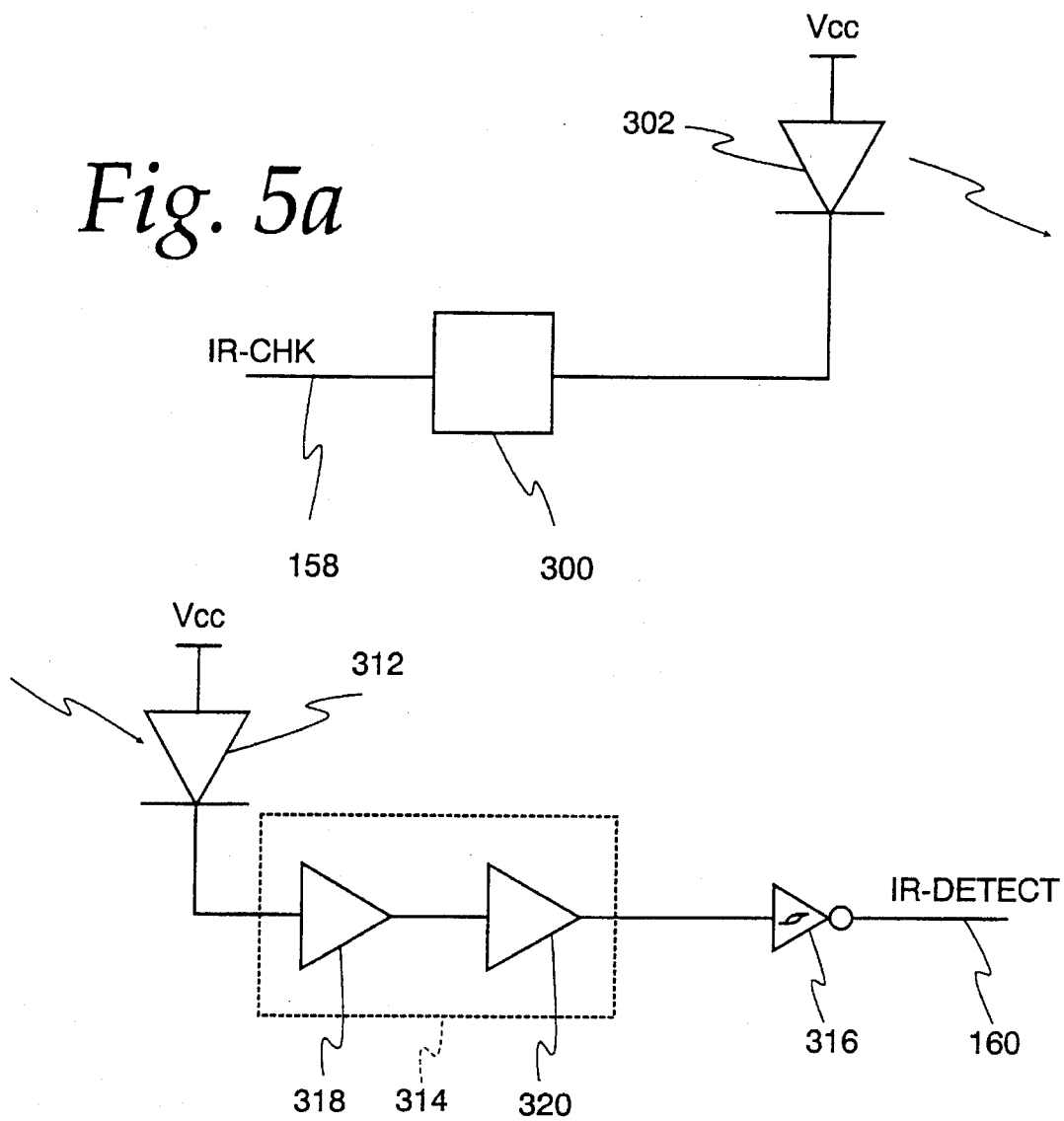
FIGS. 5a and 5b are schematic diagrams of two circuits, where the circuit in FIG. 5a is used by a metering unit to detect the presence of an external device containing the circuit in FIG. 5b.
Figure 5B:
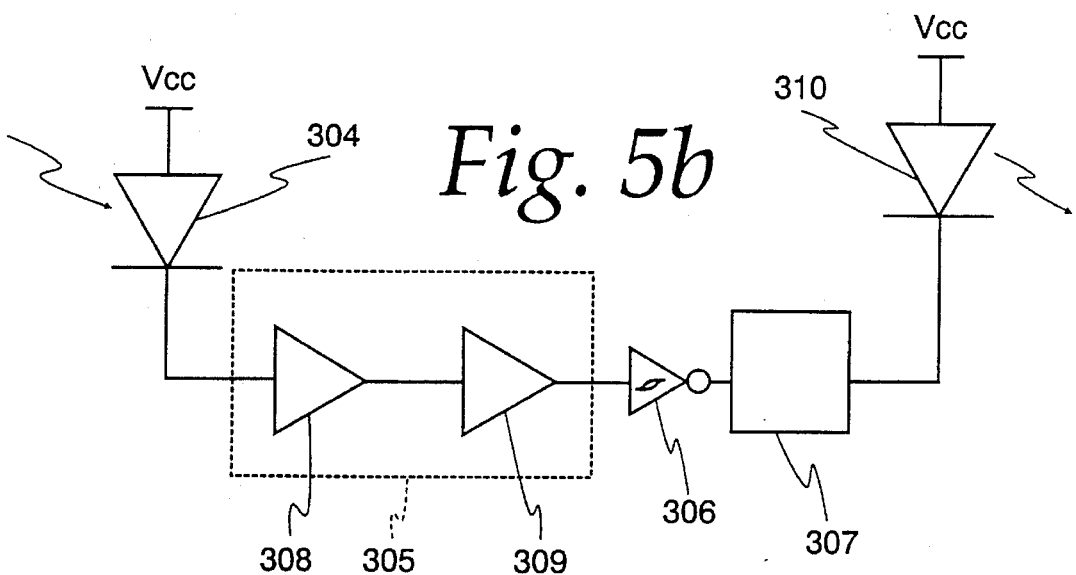

Another feature of the metering unit 104 is its ability to determine that a second device is present while, at the same time, maintaining a physical/electrical isolation from that second device. FIGS. 5a and 5b are schematic diagrams of circuits employed in the metering unit 104 and the second device, respectively, to permit the metering unit 104 to detect the presence of the second device. The circuit in FIG. 5a is located within the infrared communications interface 156 of the metering unit 104 in FIG. 4.

To detect the presence of the second device, the processor 130 generates a low duty cycle transmit signal along the IR-CHK line 158 which is passed through a driver 300 and emitted from an infrared LED transmitter 302 (FIG. 5a). The transmit signal is essentially a series of short pulses such that the transmit signal is present for a short time in an "on" state and absent for a long time in an "off" state.

If the second device is present, the transmit signal is received by the second device at an infrared LED receiver 304 (FIG. 5b). The signal received by the LED receiver 304 is immediately routed through a feedback loop to an infrared LED transmitter 310. The feedback loop includes signal conditioning circuitry 305, a Schmitt trigger 306, and a driver 307. The signal conditioning circuitry 305 preferably includes an amplifier 308 followed by a comparator 309, and the Schmitt trigger 306 is used to clean up the received signal.

Referring back to FIG. 5a, the signal emitted from the LED transmitter 310 is received by an infrared LED receiver 312 in the metering unit 104. The received signal is then routed through signal conditioning circuitry 314 and a Schmitt trigger 316 to the IR-DETECT line 160. The signal conditioning circuitry 314 in the metering unit 104 is substantially the same as the signal conditioning circuitry 305 in the second device, and similarly includes an amplifier 318 and a comparator 320.

In the presence of the second device, a pulse in the transmit signal on the IR-CHK line 158 almost instantaneously generates a corresponding pulse on the IR-DETECT line 160. Similarly, the absence of a pulse on the IR-CHK line 158 results in the absence of a pulse on the IR-DETECT line 160. Thus, the signal on the IR-DETECT line 160 follows the signal transmitted from the IR-CHK line 158. On the contrary, in the absence of the second device, the signal on the IR-CHK line 158 is not passed through the feedback loop in the second device, and the signal on the IR-DETECT line 160 does not follow the signal on the IR-CHK line 158.

The processor 130 monitors the IR-DETECT line 160 for an immediate echo of the signal pattern generated on the IR-CHK line 158. Each time a pulse is generated on the IR-CHK line 158, the processor 130 monitors the IR-DETECT line 160 for a corresponding immediate echo pulse. If a predetermined number of consecutive pulses (e.g., 20 pulses) on the IR-CHK line 158 result in a corresponding number of consecutive echo pulses on the IR-DETECT line 160, then the processor 130 determines that the second device is present and causes the CPU I/O chips 140 in FIG. 1 to switch the MUX 152 to route digital signals through the infrared communications port 156, instead of the communications port 150. By monitoring for several matching pulses on the IR-CHK line 158 and the IR-DETECT line 160, rather than a single matching pulse, the metering unit 104 is immune to false detection of another device caused by sunlight or other light sources illuminating the LED receiver 304.

In the preferred embodiment, the second device is an Optical Communications Interface (OCI) such as an infrared to RS-232 interface. Furthermore, the LED transmitters 302, 310 are implemented using MLED930 transmitters manufactured by Motorola, Inc. The LED receivers 304, 312 have receiving spectrums which match the transmitting spectrums of the LED transmitters 302, 310, and are implemented using MRD500 receivers manufactured by Motorola, Inc.

The circuitry in FIGS. 5a and 5b only permits the metering unit 104 to detect the presence of the second device. However, by providing the second device with the circuitry in FIG. 5a and the metering unit 104 with the circuitry in FIG. 5b, the second device is able to detect the presence of the metering unit 104. Thus, supplying the entire circuitry in FIGS. 5a and 5b to both the metering unit 104 and the second device permits each device to detect the presence of the other device.

What is claimed is:

1. A method for downloading firmware to a metering unit, the method comprising the steps of:

locating the metering unit in an industrial distributed power network carrying a power-related waveform to a plurality of power equipment loads, the metering unit sensing power-related parameters associated with the power-related waveform and generating and transmitting data representative thereof.

providing the metering unit with a first non-volatile memory having a first section for storing main functionality firmware and a second section for storing boot code, the boot code including a reset portion for resetting the metering unit and a firmware update section for downloading external firmware to the first section, the firmware update section including a writing routine for writing the external firmware to the first section;

providing the metering unit with a second memory; and downloading the external firmware to the first section over a broadcast-type communications link by executing the firmware update section, said step of downloading the external firmware including copying the writing routine to the second memory, and executing the writing routine stored in the second memory to write the external firmware to the first section of the first non-volatile memory.

2. The method of claim 1, further including the step of validating the external firmware written to the first section of the first non-volatile memory.

3. The method of claim 2, further including the step of resetting the metering unit following the step of validating the external firmware.

4. The method of claim 1, further including the steps of:

providing a control unit communicatively coupled to the metering unit and having the external firmware stored therein; and using the control unit to claim exclusive access to a command interface of the metering unit prior to the step of downloading the external firmware to the metering unit, thereby preventing any other devices from interfering with the step of downloading the external firmware.

5. The method of claim 1, wherein the first non-volatile memory is a sector-erasable flash EEPROM so that the boot code maintains its integrity while downloading the external firmware to the first section.

6. The method of claim 1, wherein the second memory is a volatile RAM.

7. A memory arrangement for a metering unit located in an industrial distributed power network carrying a power-related waveform to a plurality of power equipment loads, the metering unit sensing power-related parameters associated with the power-related waveform and generating and transmitting data representative thereof, the arrangement comprising:

a first non-volatile memory having a first section for storing main functionality firmware and a second section for storing boot code, said boot code including a reset portion for resetting the metering unit and a firmware update section for downloading external firmware to said first section, said firmware update section including a writing routine for writing the external firmware to said first section; and a second memory, said writing routine being copied to said second memory and executed therefrom to write the external firmware over a broadcast-type communications link to said first section.

8. The arrangement of claim 7, wherein the first non-volatile memory is a sector-erasable flash EEPROM so that said boot code maintains its integrity while downloading the external firmware to said first section.

9. The arrangement of claim 8, wherein the second memory is a volatile RAM.

10. A metering unit for use in an industrial distributed power network carrying a power-related waveform to a plurality of power equipment loads, the metering unit sensing power-related parameters associated with the power-related waveform and generating and transmitting data representative thereof, the metering unit comprising:

a first non-volatile memory having a first section for storing main functionality firmware and a second section for storing boot code, said boot code including a reset portion for resetting the metering unit and a firmware update section for downloading external firmware to said first section, said firmware update section including a writing routine for writing the external firmware to said first section; and a second memory, said writing routine being copied to said second memory and executed therefrom to write the external firmware over a broadcast-type communications link to said first section.

11. The arrangement of claim 10, wherein the first non-volatile memory is a sector-erasable flash EEPROM so that said boot code maintains its integrity while downloading the external firmware to said first section.

12. The arrangement of claim 11, wherein the second memory is a volatile RAM.

13. A firmware downloading arrangement, the arrangement comprising:

a plurality of metering units located in an industrial distributed power network carrying power-related waveforms to a plurality of power equipment loads, said metering units sensing power-related parameters associated with the power-related waveforms and generating and transmitting data representative thereof, at least one of said metering units including a sector-erasable non-volatile memory having a first section storing main functionality firmware and a second section storing boot code; and a control station, communicatively coupled to each of said metering units over a broadcast-type communications link, for downloading external firmware to said first section of said non-volatile memory, said control station claiming exclusive access to a command interface of said at least one of said metering units prior to downloading the external firmware so as to prevent other devices from interfering with said at least one of said metering units while the external firmware is downloaded to said first section.

14. The arrangement of claim 13, wherein said boot code includes a reset portion for resetting the metering unit and a firmware update section for downloading external firmware to said first section, said firmware update section including a writing routine for writing the external firmware to said first section, and further including a second memory, said writing routine being copied to said second memory and executed therefrom to write the external firmware to said first section.

15. The arrangement of claim 13, wherein each of said metering units includes a respective sector-erasable non-volatile memory having a first section storing main functionality firmware and a second section storing boot code, and wherein said control station claims exclusive access to a command interface of each of said metering units prior to downloading the external firmware so as to permit said control station to simultaneously download the external firmware to each of said metering units.

* * * * *